United States Patent
Barnes et al.

(10) Patent No.: US 6,676,811 B1
(45) Date of Patent: Jan. 13, 2004

(54) METHOD OF DEPOSITING NANOPARTICLES FOR FLUX PINNING INTO A SUPERCONDUCTING MATERIAL

(75) Inventors: Paul N. Barnes, West Milton, OH (US); P. Terry Murray, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/197,094

(22) Filed: Jul. 17, 2002

Related U.S. Application Data

(60) Provisional application No. 60/311,968, filed on Aug. 13, 2001.

(51) Int. Cl.[7] .............................................. C23C 14/34
(52) U.S. Cl. ............................. 204/192.11; 204/192.24
(58) Field of Search ...................... 204/192.11, 192.24; 427/62, 419.3, 419.2, 402

(56) References Cited

U.S. PATENT DOCUMENTS

| | | | | |
|---|---|---|---|---|
| 5,885,939 A | * | 3/1999 | Matsunaga et al. | 505/474 |
| 6,060,433 A | * | 5/2000 | Li et al. | 505/473 |
| 6,524,643 B1 | * | 2/2003 | Nakamura et al. | 427/82 |

* cited by examiner

Primary Examiner—Steven H. VerSteeg
(74) Attorney, Agent, or Firm—Richard A. Lambert; Bobby D. Scearce; Thomas L. Kundert

(57) ABSTRACT

A method of depositing nanoparticles for flux pinning into a superconducting material is described. According to the method of the present invention, a target made of superconducting material and a substrate are placed in the deposition chamber of a pulsed laser deposition apparatus. A first, moderate vacuum level is established in the chamber and the target is irradiated with light from a pulsed, high energy laser. By virtue of the moderate vacuum level, the material ejected from the target is slowed sufficiently to agglomerate into nanoparticles having the same composition as the target material. These nanoparticles are deposited upon the substrate. A uniform layer of superconducting material is deposited on the substrate by evacuating the deposition chamber to a second, high vacuum level and performing the pulsed laser deposition process again. The nanoparticles thus deposited within the superconducting material act as a flux pinning mechanism.

33 Claims, 1 Drawing Sheet

METHOD OF DEPOSITING NANOPARTICLES FOR FLUX PINNING INTO A SUPERCONDUCTING MATERIAL

The present application is related to and claims priority on prior copending U.S. Provisional Application No. 60/311, 968, filed Aug. 13, 2001, entitled "Method Of Depositing Nanoparticles For Flux Pinning Into A Superconducting Material".

RIGHTS OF THE GOVERNMENT

The invention described herein may be manufactured and used by or for the Government of the United States for all governmental purposes without the payment of any royalty.

BACKGROUND OF THE INVENTION

The present invention relates generally to high temperature superconducting and more particularly to a method of depositing nanoparticles for flux pinning into a superconducting material.

The desirability of providing efficient high temperature superconductors for operation at 20° K. and higher is well known. Indeed, there has been an enormous amount of experimental activity in these so called high temperature superconductors since research in the mid 1980s first demonstrated dramatic gains in raising the maximum critical transition temperatures from the 20° K. range to the 90° K. range.

In general, superconductors and superconducting material exhibit zero resistance when operating at temperatures below their maximum critical transition temperature. This quality of operating at zero resistance facilitates the construction and operation of highly efficient devices such as superconducting magnets, magnetic levitators, propulsion motors and magnetohydronamics, power generators, particle accelerators, microwave and infrared detectors, etc.

In addition to the quality of operating at zero resistance, superconductors display other, unusual characteristics. For example, a surprising effect of superconductivity is that magnetic flux is expelled from superconductors. This is commonly known as the Meissner or Meissner-Ochsenfeld effect. Other unexpected phenomena include current flow via electron pairs rather than individual electrons and large scale quantum behaviors such as flux quantization and flux tubes.

According to current accepted nomenclature, superconducting materials fall within two broad categories, Type I and Type II. The Type I materials are pure metallic elements. Type II materials are alloys or compounds and are characterized by their ability to retain superconductive attributes in the presence of applied magnetic fields. Unlike Type I materials, Type II materials tolerate some degree of applied magnetic flux intrusion into their interiors without destroying the superconducting state. More specifically, as applied flux and/or temperature increase, microscopic flux tubes or fluxons begin to develop within the material. In this mixed state of superconductivity, the material within the flux tubes is in a normal state of resistivity. The material surrounding the flux tubes remains in a state of superconductivity. Since the Type II materials will support mixed superconductivity at elevated temperatures and applied magnetic field intensities, the Type II materials seem to be the best candidates for commercial application and further development.

Under equilibrium conditions, magnetic flux penetrates the bulk of a type II superconductor above the lower critical field. Over most of the available magnetic field-temperature (H-T) space, H>Hc1, this magnetic flux exists as a lattice of quantized line vortices or fluxons. Each fluxon is a tube in which superconducting screening currents circulate around a small non-superconducting core. Bulk superconductivity is destroyed when the normal cores overlap at the upper critical field. In isotropic materials such as Nb-Ti and Nb3Sn, vortex lines are continuous, but the weak superconductivity of the blocking layers of High Temperature Superconducting (HTS) compounds produces a stack of weakly coupled 'pancake' vortices whose circulating screening currents are mostly confined within the superconducting CuO2 planes. Superconductors can carry bulk current density only if there is a macroscopic fluxon density gradient. This gradient can be sustained only by pinning the vortices (flux pinning) at microstructural defects. Increasing T and H weaken the potential wells at which vortices are pinned. Flux pinning is determined by spatial perturbations of the free energy of the vortex lines due to local interactions of their normal cores and screening currents with these microstructural imperfections. The critical current density Jc (T, H) is then defined by the balance of the pinning and Lorentz forces. Ideally, a type II superconductor can carry any non-dissipative current density J smaller than Jc. When J exceeds Jc, a superconductor switches into a dissipative, vortex-flow state driven by the Lorentz force.

Various attempts have been made to stabilize or pin the flux vortices. Introducing impurities or defects into the superconducting material is a known way to provide flux pinning. Such flux pins can be holes, nanotubes, particles, grain boundaries or other defects intentionally introduced into the superconducting material.

While the known methods of introducing defects into the superconducting material for flux pinning have achieved some degree of success in operation, these methods usually require an additional processing station, extra processing equipment and/or require the preincorporation of foreign material during processing, potentially inhibiting the proper growth of the superconducting material. As such, these methods are not without the need for improvement.

A need exists therefore for an improved method of depositing nanoparticles for flux pinning into a superconducting material. Such a method would be simple in nature, capable of in-situ completion, and not introduce foreign material or otherwise inhibit the operation of the superconducting material.

SUMMARY OF THE INVENTION

Accordingly, it is a primary object of the present invention to provide a method of depositing nanoparticles for flux pinning into a superconducting material.

Another object of the present invention is to provide a method of depositing nanoparticles for flux pinning into a superconducting material that utilizes pulsed laser deposition.

Still another object of the present invention is to provide a method of depositing nanoparticles for flux pinning into a superconducting material that is simple to complete and can be performed in-situ in conjunction with the pulsed laser deposition process for depositing the superconducting material upon the substrate.

It is yet another object of the present invention to provide a method of depositing nanoparticles for flux pinning into a superconducting material that provides for enhanced superconductor operation by introducing flux pin defects into the superconducting material without introducing foreign material.

It is still another object of the present invention to provide a method of depositing nanoparticles for flux pinning into a superconducting material that is simple to perform.

These and other objects of the invention will become apparent as the description of the representative embodiments proceeds.

In accordance with the foregoing principles and objects of the invention, a method of depositing nanoparticles for flux pinning into a superconducting material is described.

In the preferred embodiment, the method of the present invention is performed using the pulsed laser deposition method within a corresponding deposition chamber. Pulsed laser deposition systems are known to those skilled in the art and are commercially available. The method of the present invention utilizes a laser operated in a pulsed mode to irradiate a target. The interaction of the laser and the target causes ejection of atomic and molecular and ionic species from the target. The material expelled by the target is collected on a substrate. Pulsed laser deposition processes are well known in the art and according to the standard practice, the typical deposition process is conducted in a relatively high vacuum, 100–900 mTorr of $O_2$, for example. The high vacuum level is considered necessary for the deposition of a uniform layer of material on the substrate. In this application, $O_2$ is used for YBCO to enhance oxygenation.

According to an important aspect of the present invention, the irradiation of the target is first conducted at a much more moderate vacuum level, in the range of 1–10 Torr of $O_2$, contrary to current, standard practice for HTS deposition. This has the effect of slowing down the ejected material by collisions with the background gas, allowing the ejected atoms and molecules to recombine in the gas phase. This recombination produces nanoparticles of the target material which are then collected on the substrate. The irradiation continues for a time sufficient to collect the desired layer of nanoparticles on the substrate.

After the desired layer of nanoparticles is deposited on the substrate, the pressure in the deposition chamber is, in the range, for example of 100–900 mTorr of $O_2$. The target is again irradiated by the pulsed laser according to the current standard pulsed laser deposition process. These two steps can be repeated as desired to form any number of layers of nanoparticles covered by a uniform layer of material. Advantageously, the method of the present invention can be utilized on all Type II superconducting materials amenable to the pulsed laser deposition process.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
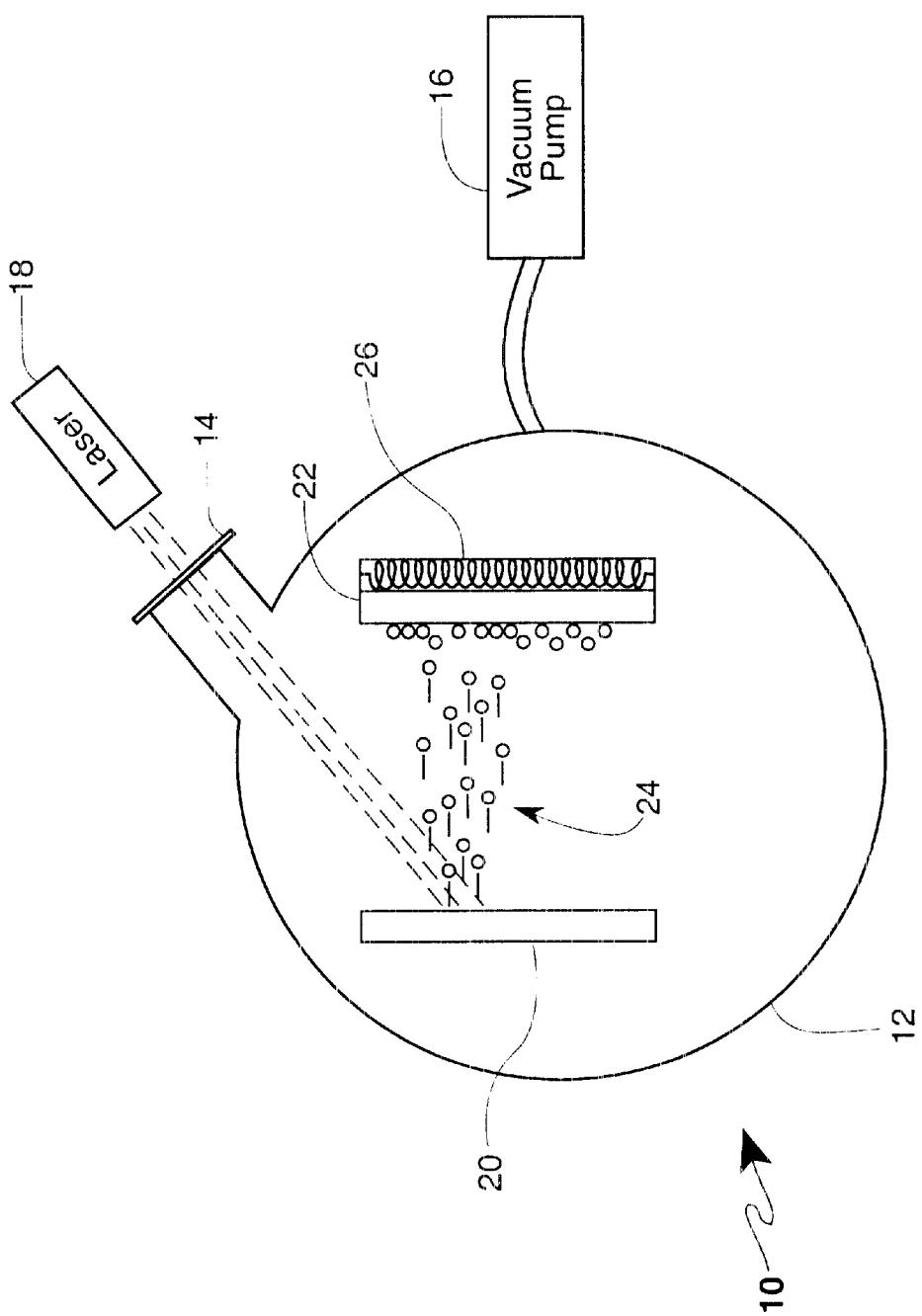
FIG. 1 is a diagrammatic view of a pulsed laser deposition system shown during performance of the method of the present invention.

Reference is made to FIG. 1 showing a representative pulsed laser deposition system 10 for performing the method of the present invention. Pulsed laser deposition systems are commercially available or they can be made in-house. One commercial supplier of pulsed laser deposition systems suitable for performing the steps of the present invention is Neocera, Inc., Beltsville, Md.

As shown, the system 10 includes a deposition chamber 12. As is known in the art, the deposition chamber includes several windows 14 for viewing and for transmission of laser energy, only one of which is shown herein for clarity. A vacuum pump 16 is provided to evacuate the deposition chamber for the pulsed laser deposition process. As will be described in more detail below, a pulsed laser 18 is used to irradiate a target within the deposition chamber 12 in order to deposit the material on the substrate.

In order to perform the steps of the present method, a target 20 and a substrate 22 are placed within the deposition chamber 12. The target material can be any of a number of Type II superconducting materials. The high temperature superconducting material $Y_1Ba_2Cu_3O_{7-x}$, (YBCO) has demonstrated the ability for excellent performance at liquid nitrogen temperatures, maintaining current densities above $10^5$ A/cm$^2$ even at a few Tesla. YBCO is thus an excellent candidate conductor material and has been successfully deposited according to the teachings of the present invention.

As stated above, the target 20 and a substrate 22 upon which layers of YBCO will be grown are placed in the deposition chamber 12. A heater 26 is provided to heat the substrate 22 according to HTS deposition standard practice. According to an important aspect of the present invention, the deposition chamber 12 is evacuated to a relatively moderate first vacuum level, which, contrary to standard pulsed laser deposition practice, is in the range of about 1 to 10 Torr $O_2$. The target 20 is then irradiated with pulsed light emanating from the laser 18. The interaction of the pulsed light from the laser 18 and the target 20 causes ejection of atomic and molecular species from the target. By virtue of the relatively moderate, first vacuum level, ejected material is slowed by collisions with the background gas, typically $O_2$. This allows the ejected atoms and molecules to recombine in the gas phase to effectively produce nanoparticles having the same composition as the target material. The nanoparticles 24 then collect on the substrate 22. The laser irradiation,continues for a time sufficient to collect the desired layer of nanoparticles on the substrate. In this way, nanoparticles having the same material composition as the target material are formed and deposited on the substrate although the nanoparticles need not be of the same material composition.

A uniform layer of superconducting material (not shown) is then deposited upon the substrate 22 by evacuating the deposition chamber 12 to a second, relatively high vacuum level, from about 100–900 mTorr $O_2$. The target 20 is again irradiated by the laser 18. Material is ejected from the target 20, but at this second, high vacuum level, the atoms and molecules of the ejected material are not slowed by an interaction with gas molecules. Accordingly, they strike the substrate without having been recombined into nanoparticles. This process continues for a sufficient time to deposit the desired uniform layer of superconducting material upon the substrate. If desired, the steps above can be repeated any number of times in order to form alternating layers of nanoparticles and uniform superconducting material. In this way, the nanoparticles are dispersed within the superconducting material to act as a flux pinning mechanism, enhancing efficiency of the superconductor.

Advantageously, the nanoparticle formation step is performed entirely in situ, within the deposition chamber 12, in conjunction with the standard superconducting material pulsed laser deposition process, simplifying fabrication and reducing cost. And, the nanoparticles are composed of the same material, avoiding the introduction of any foreign material into the superconductor thus fabricated.

As an example of the method of the present invention, the deposition chamber 12 was evacuated to a vacuum of 5 Torr $O_2$. A YBCO target 20 was irradiated with the output of a KrF 248 nm excimer laser operated at a pulse rate of 4 Hz and having an output energy of about 50 mJ per pulse. The target 20 to substrate 22 distance was 25 mm and the deposition time was 2 minutes. As a result, nanoparticles in the range of ~3 to 5 nm were deposited upon the substrate.

It is believed that nanoparticle formation is dependent on vacuum level and laser energy. For example, when the laser 18 output was increased to 100 mJ per pulse, no nanoparticles were deposited. And, as stated above, when the vacuum level is too high, the ejected material has an insufficient residence time in the gas phase to agglomerate as YBCO nanoparticle material and instead deposits on the substrate as a uniform layer of material.

In summary, numerous benefits have been described from utilizing the principles of the present invention. The method of the present invention can be used to reliably deposit nanoparticles for flux pinning within superconducting materials. By irradiating the target at a first, moderate vacuum material, the ejected material agglomerates into nanoparticles having the same composition as the target. These nanoparticles provide effective flux pinning mechanisms to enhance superconductor operation.

The foregoing description of the preferred embodiment has been presented for purposes of illustration and description. It is not intended to be exhaustive or to limit the invention to the precise form disclosed. Obvious modifications or variations are possible in light of the above teachings. For example, the layer of nanoparticles can be deposited on the substrate after a layer of superconducting material is first deposited rather than before as described above. In this case, the first and second vacuum levels are effectively reversed, such that the first vacuum level to be established is the relatively high level in the range of about 100–900 Torr $O_2$. And the second level would be in the range of about 1–10 Torr $O_2$. In this way, a layer of superconducting material is deposited first, and a layer of nanoparticles is next deposited thereon. The embodiment described was chosen to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A method of depositing a flux pinning mechanism into a superconducting material, comprising the steps of:
   providing a deposition chamber;
   placing a target and a substrate within said deposition chamber;
   establishing a first vacuum level within said deposition chamber;
   irradiating said target with a pulsed laser to eject material from said target;
   collecting a layer of said ejected material on said substrate;
   evacuating said deposition chamber to a second vacuum level;
   depositing a layer of superconducting material upon said substrate; and,
   repeating said establishing step through said depositing step to create additional layers of ejected material covered by superconducting material.

2. The method of claim 1 wherein said first vacuum level is in the range of about 1 to 10 Torr $O_2$.

3. The method of claim 2 wherein said first vacuum level is 5 Torr $O_2$.

4. The method of claim 1 wherein said target is fabricated from $YBa_2Cu_3O_7$.

5. The method of claim 1 wherein said second vacuum level is in the range of about 100–900 mTorr $O_2$.

6. The method of claim 1 wherein said pulsed laser is a KrF 248 nm excimer laser.

7. The method of claim 6 wherein said pulsed laser has an energy of about 50 mJ per pulse.

8. The method of claim 1 wherein said superconducting material in said depositing step is $YBa_2Cu_3O_7$.

9. The method of claim 1 wherein said pulsed laser is pulsed at about 4 Hz.

10. A method of depositing a flux pinning mechanism into a superconducting material, comprising the steps of:
    providing a deposition chamber;
    placing a target and a substrate within said deposition chamber;
    establishing a first vacuum level within said deposition chamber;
    irradiating said target with a pulsed laser to eject material from said target;
    collecting a layer of ejected material on said substrate;
    establishing a second vacuum level within said deposition chamber;
    irradiating said target with said pulsed laser to eject material from said target; and,
    collecting a layer of said ejected material from said second irradiating step above on said substrate.

11. The method of claim 10 wherein said first vacuum level is in the range of about 1 to 10 Torr $O_2$.

12. The method of claim 11 wherein said first vacuum level is 5 Torr $O_2$.

13. The method of claim 10 wherein said target is fabricated from $YBa_2Cu_3O_7$.

14. The method of claim 10 wherein said second vacuum level is in the range of about 100–900 mTorr $O_2$.

15. The method of claim 10 wherein said pulsed laser is a KrF 248 nm excimer laser.

16. The method of claim 15 wherein said pulsed laser has an energy of about 50 mJ per pulse.

17. The method of claim 10 wherein said pulsed laser is pulsed at about 4 Hz.

18. A method of depositing a flux pinning mechanism into a superconducting material, comprising the steps of:
    providing a deposition chamber;
    placing a target and a substrate within said deposition chamber;
    establishing a first vacuum level within said deposition chamber;
    irradiating said target with a pulsed laser to eject material from said target;
    forming nanoparticles of said ejected material;
    collecting a layer of said nanoparticles on said substrate;
    evacuating said deposition chamber to a second vacuum level;
    irradiating said target with said pulsed laser to eject material from said target; and,
    depositing a layer of ejected material from said second irradiating step above upon said substrate.

19. The method of claim 18, wherein said first vacuum level is in the range of about 1 to 10 Torr $O_2$.

20. The method of claim 19 wherein said first vacuum level is 5 Torr $O_2$.

21. The method of claim 18 wherein said target is fabricated from $YBa_2Cu_3O_7$.

22. The method of claim 18 wherein said second vacuum level is in the range of about 100–900 mTorr $O_2$.

23. The method of claim 18 wherein said pulsed laser is a KrF 248 nm excimer laser.

24. The method of claim 23 wherein said pulsed laser has an energy of about 50 mJ per pulse.

25. The method of claim 18 wherein said pulsed laser is pulsed at about 4 Hz.

26. A method of depositing a flux pinning mechanism into a superconducting material, comprising the steps of:

providing a deposition chamber;

placing a target and a substrate within said deposition chamber;

establishing a first vacuum level within said deposition chamber;

irradiating said target with a pulsed laser to eject material from said target;

depositing a layer of ejected material upon said substrate;

establishing a second vacuum level within said deposition chamber;

irradiating said target with said pulsed laser to eject material from said target;

forming nanoparticles of said ejected material; and, collecting a layer of said nanoparticles on said substrate.

27. The method of claim 26 wherein said second vacuum level is in the range of about 1 to 10 Torr $O_2$.

28. The method of claim 27 wherein said second vacuum level is 5 Torr $O_2$.

29. The method of claim 26 wherein said target is fabricated from $YBa_2Cu_3O_7$.

30. The method of claim 26 wherein said first vacuum level is in the range of about 100–900 mTorr $O_2$.

31. The method of claim 26 wherein said pulsed laser is a KrF 248 nm excimer laser.

32. The method of claim 31 wherein said pulsed laser has an energy of about 50 mJ per pulse.

33. The method of claim 26 wherein said pulsed laser is pulsed at about 4 Hz.

* * * * *